US006560134B2

(12) United States Patent
Brox et al.

(10) Patent No.: US 6,560,134 B2
(45) Date of Patent: May 6, 2003

(54) MEMORY CONFIGURATION WITH A CENTRAL CONNECTION AREA

(75) Inventors: Martin Brox, München (DE);
Karl-Peter Pfefferl, Höhenkirchen-Siegertsbrunn (DE);
Helmut Schneider, München (DE);
Robert Kaiser, Kaufering (DE);
Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/014,776

(22) Filed: Nov. 7, 2001

(65) Prior Publication Data

US 2002/0062430 A1 May 23, 2002

(30) Foreign Application Priority Data

Nov. 7, 2000 (DE) .......................................... 100 55 001

(51) Int. Cl.[7] .............................. G11C 5/02; G11C 5/06
(52) U.S. Cl. ........................................... 365/51; 365/63
(58) Field of Search ........................ 365/51, 63, 230.03

(56) References Cited

U.S. PATENT DOCUMENTS

| | | | | |
|---|---|---|---|---|
| 5,577,223 A | * | 11/1996 | Tanoi et al. ............ 365/230.03 |
| 5,742,101 A | | 4/1998 | Sakuta et al. ................ 257/786 |
| 5,966,316 A | * | 10/1999 | Tsukikawa ............. 365/230.03 |
| 6,049,500 A | * | 4/2000 | Kajigaya et al. ........ 365/230.03 |
| 6,064,621 A | * | 5/2000 | Tanizaki et al. ........ 365/230.03 |
| 6,069,812 A | * | 5/2000 | Lee et al. ....................... 365/63 |
| 6,094,382 A | * | 7/2000 | Choi et al. .................... 365/200 |
| 6,215,720 B1 | * | 4/2001 | Amano et al. ......... 365/230.03 |
| 6,407,939 B2 | * | 6/2002 | Merritt ........................ 365/51 |

FOREIGN PATENT DOCUMENTS

JP      05343634 A     12/1993

OTHER PUBLICATIONS

Search Report issued by the German Patent and Trademark Office on Nov. 7, 2000.

* cited by examiner

*Primary Examiner*—Trong Phan
(74) *Attorney, Agent, or Firm*—Laurence A. Greenberg; Werner H. Stemer; Ralph E. Locher

(57) ABSTRACT

A memory configuration includes a central connection area. The central connection area is surrounded annularly by cell arrays having memory cells. The memory configuration has compact external dimensions and is suitable, in particular, for a side ratio of 2:1. All the peripheral circuits are preferably disposed in the central connection area. As a result, the propagation time differences between the peripheral circuits and the various cell arrays are relatively small.

14 Claims, 3 Drawing Sheets

FIG 1

MEMORY CONFIGURATION WITH A CENTRAL CONNECTION AREA

BACKGROUND OF THE INVENTION

Field of the Invention

The invention relates to a memory configuration having a connection area and cell arrays that adjoin the connection area. The cell array has a matrix-like memory with row and column decoders that are each connected to address lines.

Semiconductor memories are typically built up from small, regular cell units (e.g., in the case of a 256 Mb DRAM, the cell units are 4 Mb). The cell units are combined into larger configurations (cell arrays) that, in the case of a 256 Mb DRAM, in turn often have a size of 64 Mb. In the case of the 256 Mb DRAM, it is, therefore, necessary for four of these cell arrays to be disposed on the module. It is often the case that two cell arrays are disposed beside each other in each case and a connection area is formed between two adjacently disposed cell arrays. The connection area has bonding pads that are connected to the switching elements of the cell arrays and are used for connecting further circuits. Because an individual cell array often has a side ratio of 2:1, and the connection area is relatively small, the result, for example, in the case of the 256 Mb DRAM having four cell arrays, is immediately an overall side ratio of 2:1. In the case of a 512 Mb DRAM, in which eight cell arrays (512 M=8*64 M) then have to be placed, two alternatives then remain in the prior art:

a) four cell arrays beside one another; or b) in each case four cell arrays in a 2*2 configuration on both sides of the connection area.

Both configurations have an unfavorable side ratio of 4:1 (case(a)) or 1:1 (case(b)). Under certain circumstances, the side ratios lead to chip dimensions that no longer fit into standardized housings.

SUMMARY OF THE INVENTION

It is accordingly an object of the invention to provide a memory configuration with a central connection area that overcomes the herein afore-mentioned disadvantages of the heretofore-known devices of this general type and that provides memory arrays with a more flexible construction.

With the foregoing and other objects in view, there is provided, in accordance with the invention, a memory configuration including address lines, cell arrays having side edges, and a centrally disposed connection area having four side edges, including longitudinal sides, and connecting pads. The cell arrays adjoin the connection area, are disposed on each of the four side edges of the connection area in a closed ring around the connection area, each have a matrix-like memory with decoders each connected to at least one of the address lines, each have at least two side edges adjoining side edges of two other ones of the cell arrays, and each are subdivided in a longitudinal direction into a first cell subarray and a second cell subarray. The connecting pads are electrically connected to the cell arrays. Each of the first and second cell subarrays have longitudinal sides adjoining the connection area and another one of the cell arrays and a decoder disposed at right angles to one of the longitudinal sides adjoining one of the group consisting of the connection area and the another one of the cell arrays. Each of the cell arrays having two mutually adjoining decoders is disposed in a center of one of the longitudinal sides of the connection area. A first of the decoders is connected to first of the address lines disposed parallel to the longitudinal direction in the first cell subarray. A second of the decoders connected to second of the address lines disposed parallel to the longitudinal direction in the second cell subarray.

A significant advantage of the invention is that a centrally disposed connection area is provided, which is surrounded annularly by cell arrays. As such, a very compact configuration of a large number of cell arrays in one memory configuration is achieved.

In accordance with another feature of the invention, the decoders of each of the cell arrays include row decoders and column decoders each connected to the address lines.

In accordance with a further feature of the invention, the decoder of each of the first and second cell subarrays is one of the group consisting of a row decoder and a column decoder.

In accordance with an added feature of the invention, the connection area is rectangular and has four corner areas, the cell arrays are each rectangular, each of the four side edges of the connection area have a respective length, four of the cell arrays adjoin a respective one of the four side edges of the connection area and each of the four cell arrays have a side edge with a length equal to the respective length of each of the four side edges, others of the cell arrays are respectively disposed in each of the four corner areas, and an overall area defined by the connection area and the cell arrays is rectangular.

In addition, it is advantageous to construct the connection area and the cell arrays rectangularly, a cell array with a side edge of an appropriate size adjoining each side edge of the connection area. In each case, a further cell array is disposed in the corner areas of the connection area. Such a memory configuration embodiment has a rectangular outer contour. Therefore, the memory configuration is particularly suitable for a standard housing having a side edge ratio of 2:1.

In accordance with an additional feature of the invention, a line decoder or a row decoder is constructed in the areas of the side edges of a cell array that adjoins another cell array or the connection area. As such, the line or row decoder is disposed relatively close to the central connection area so that the signal paths for reading data out or writing data into the cell arrays are relatively short.

In accordance with yet another feature of the invention, the connection area has transverse sides, the connecting pads include connecting pad rows, a first row, a second row, a third row, and a fourth row of the connecting pad rows are disposed at a predefined distance parallel to the transverse sides of the connection area, a fifth row and a sixth row of the connecting pad rows are disposed at a predefined distance parallel to the longitudinal sides of the connection area, the first and second rows and the third and fourth rows are respectively disposed on a given line and are disposed at a predefined distance from one another, and the fifth row and the sixth row are respectively disposed centrally with respect to the first and third rows and the second and fourth rows.

In accordance with yet a further feature of the invention, the fifth row and the sixth row are respectively disposed between the first, second, third, and fourth rows.

In accordance with yet an added feature of the invention, the is fifth row and the sixth row are respectively disposed between the first and third rows and the second and fourth rows and the longitudinal edges of the connection area.

In a preferred embodiment, the bonding pads in the connection area are disposed in the form of four rows, the four rows being disposed parallel to the four outer edges of the connection area. As such, a symmetrical distribution of the connecting pads is made possible.

In accordance with yet an additional feature of the invention, there are provided peripheral circuits for operating the cell arrays, the peripheral circuits connected to the cell arrays and disposed in the connection area.

It is advantageous to configure peripheral circuits in the central connection area. The peripheral circuits are, therefore, virtually equally far removed from all the cell arrays, so that propagation time differences between the signals from various cell arrays are relatively small.

In accordance with again another feature of the invention, a cell array preferably has approximately the same size as the connection area.

In accordance with again a further feature of the invention, each cell array is once more divided into two cell subarrays.

In accordance with a concomitant feature of the invention, the connection area and/or the cell arrays are twice as long as they are wide.

Other features that are considered as characteristic for the invention are set forth in the appended claims.

Although the invention is illustrated and described herein as embodied in a memory configuration with a central connection area, it is, nevertheless, not intended to be limited to the details shown because various modifications and structural changes may he made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a diagrammatic illustration of a first memory configuration according to the invention;

DESCRIPTION OF THE PREFERRED EMBODIMENTS

Figure 1:
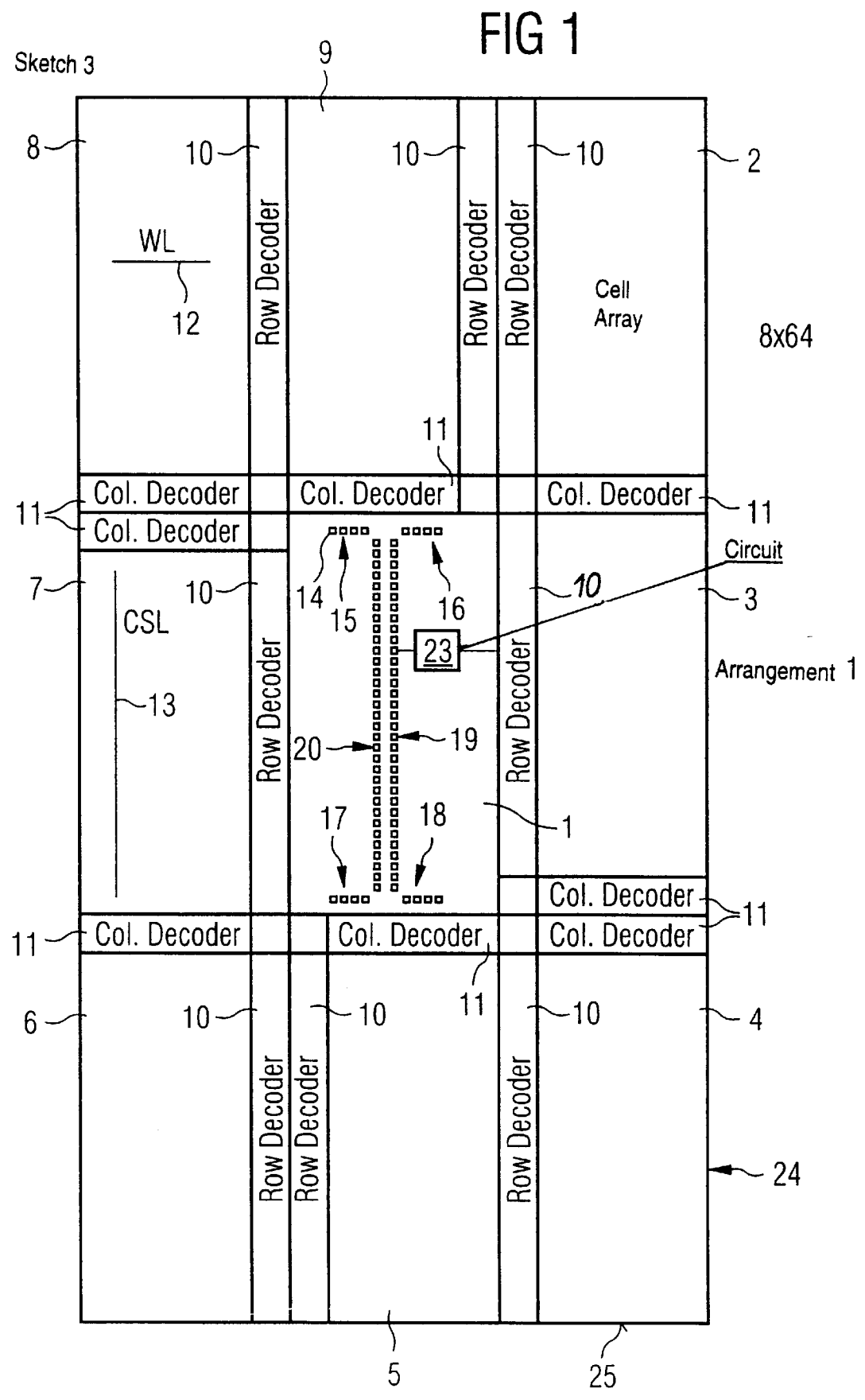
Figure 2:
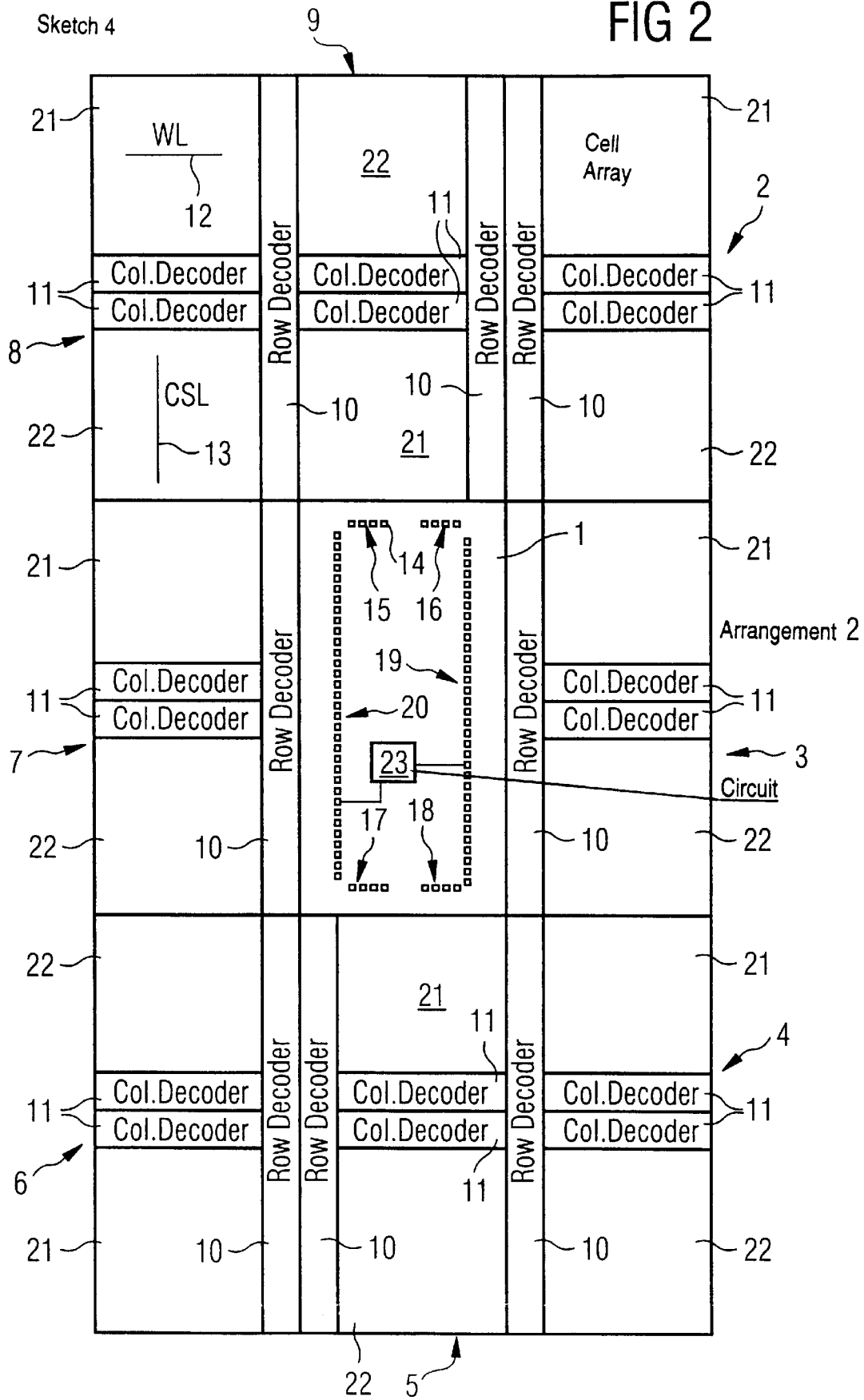
FIG. 2 is a diagrammatic illustration of a second memory configuration according to the invention.

Referring now to the figures of the drawings in detail and first, particularly to FIG. 1 thereof, there is shown a memory configuration that, in terms of the external contour, is constructed rectangularly. A longitudinal edge 24 of the memory configuration is virtually twice as long as a transverse edge 25 of the memory configuration. The memory configuration is, therefore, suitable for incorporation in a standard housing having a side ratio of approximately 2:1. Such a side ratio is used, for example, in the case of an intermediate memory size of 128 megabits, 512 megabits, 2 gigabits, and so on. Because of the external contours of the memory configurations, it is possible, for example, to incorporate the 512 megabit DRAM as early as one technological generation earlier into a standard housing than in architectures from the prior art.

Disposed at the center of the memory configuration is a connection area 1 having a rectangular construction. The side ratio of the connection area 1 has a ratio between the longitudinal side and the transverse side of approximately 2:1. Formed in the connection area 1 are bonding pads 14 that are disposed in rows. A bonding pad 14 is used for connecting a bonding wire that is led from the bonding pad to connecting pins of a housing. The bonding pads are connected to circuits and cell arrays. The rows 15, 16, 17, 18, 19, 20 are respectively disposed parallel to and at a predefined distance from the transverse edge and the longitudinal edge of the connection area 1. In the exemplary embodiment described, first and second rows 15, 16 are disposed at a predefined distance from the upper transverse edge of the connection area 1, the first and second rows 15, 16 in turn having a predefined distance from each other and, symmetrically in each case, being at the same distance from the two longitudinal edges.

Furthermore, third and fourth rows 17, 18 are formed and are disposed mirror-symmetrically in relation to the first and second row 15, 16 in the connection area 1. Fifth and sixth rows 19, 20 of bonding pads 14 are respectively disposed at a predefined distance from and parallel to the longitudinal edges. The fifth and sixth rows 19, 20 are disposed in the intermediate area by which the first and second and third and fourth rows 15, 16, 17, 18 are spaced apart. As such, a symmetrical distribution of the bonding pads 14 is achieved. Therefore, a relatively large amount of space for welding the bonding pads 14 to bonding wires is provided and, in addition, the cell arrays are disposed around the bonding pads at virtually the same distance. However, other configurations of bonding pads, such as the configuration in one row, are also possible.

The connection area 1 is surrounded in the form of a ring by a first, second, third, fourth, fifth, sixth, seventh, eighth cell array 2, 3, 4, 5, 6, 7, 8, 9. The cell arrays are constructed in form and size corresponding to the connection area 1. A cell array constitutes a matrix-like memory array with memory cells. In addition, a cell array is disposed on each longitudinal and transverse edge of the connection area 1, so that in each case a transverse edge of two cell arrays 9, 5 respectively adjoins the upper and lower transverse edge of the connection area 1, and the longitudinal edges of the fourth and eighth cell arrays 5, 9 and the connection area 1 form a straight line. A side edge of a second and sixth cell array 3, 7 respectively adjoins a side edge of the connection area 1, the second and sixth cell arrays 3, 7 being disposed such that the transverse edges of the second and sixth cell array and the connection area 1 in each case form a straight line.

Disposed in the corner areas are first, third, fifth and seventh cell arrays 2, 4, 6, 8, such that the outer edges of the cell arrays form a rectangular contour. The cell arrays 2 to 9 have an identical construction. Each cell array has a row decoder 10 with row lines 12 and a column decoder 11 with column lines 13. Through the row and column decoders 10, 11, contact is made with the individual memory cells in the memory array, which are located at respective crossing points of the row select lines and column select lines 12, 13. Each row decoder 10 and column decoder 11 is electrically connected to bonding pads 14. The row decoders 10 are disposed along the longitudinal edges in the respective cell arrays. The column decoders 11 are disposed adjacent to the transverse edges in the respective cell array. The row decoders 10 and column decoders 11 are always disposed at edges that adjoin a cell array or a connection area 1. Thus, the row decoders 10 and column decoders 11 are located relatively close to the connection area 1, so that the signal paths between the row decoders 10, the column decoders 11, and the connecting pads 14 and/or the peripheral circuits 23 are relatively short.

The connection area 1 has a plurality of peripheral circuits 23 that are electrically connected to bonding pads 14 and/or to the cell arrays. The peripheral circuits 23 provided are, for example, amplifier circuits, control logic, and further circuits that are needed to operate the memory configuration.

FIG. 2 illustrates a further embodiment of a memory configuration in which, as compared with the memory configuration of FIG. 1, the previous cell arrays 2 to 9 are each subdivided into a first and second cell subarray 21, 22. Each cell subarray 21, 22 has its own column decoder 11. Thus, each cell array 2 to 9 has a row decoder 10 and two column decoders 11. Data access to the data belonging to a row select line is, therefore, quicker because the bit lines are shorter.

The cell arrays 2 to 9 are disposed annularly around the connection area 1, corresponding to the embodiment of FIG. 1. A further difference from the embodiment of FIG. 1 is in the configuration of the bonding pads 14. The first, second, third, and fourth rows 15, 16, 17, 18 of bonding pads 14 are disposed in accordance with FIG. 1. Although the fifth and sixth rows 19, 20 are likewise disposed parallel to the longitudinal edges, they are at a significantly smaller distance from the side edges and are disposed between the first, second, third, and fourth rows 14, 15, 16, 17, 18 and the longitudinal edges. In addition, peripheral circuits 23 are formed in the connection area 1.

Figure 3:
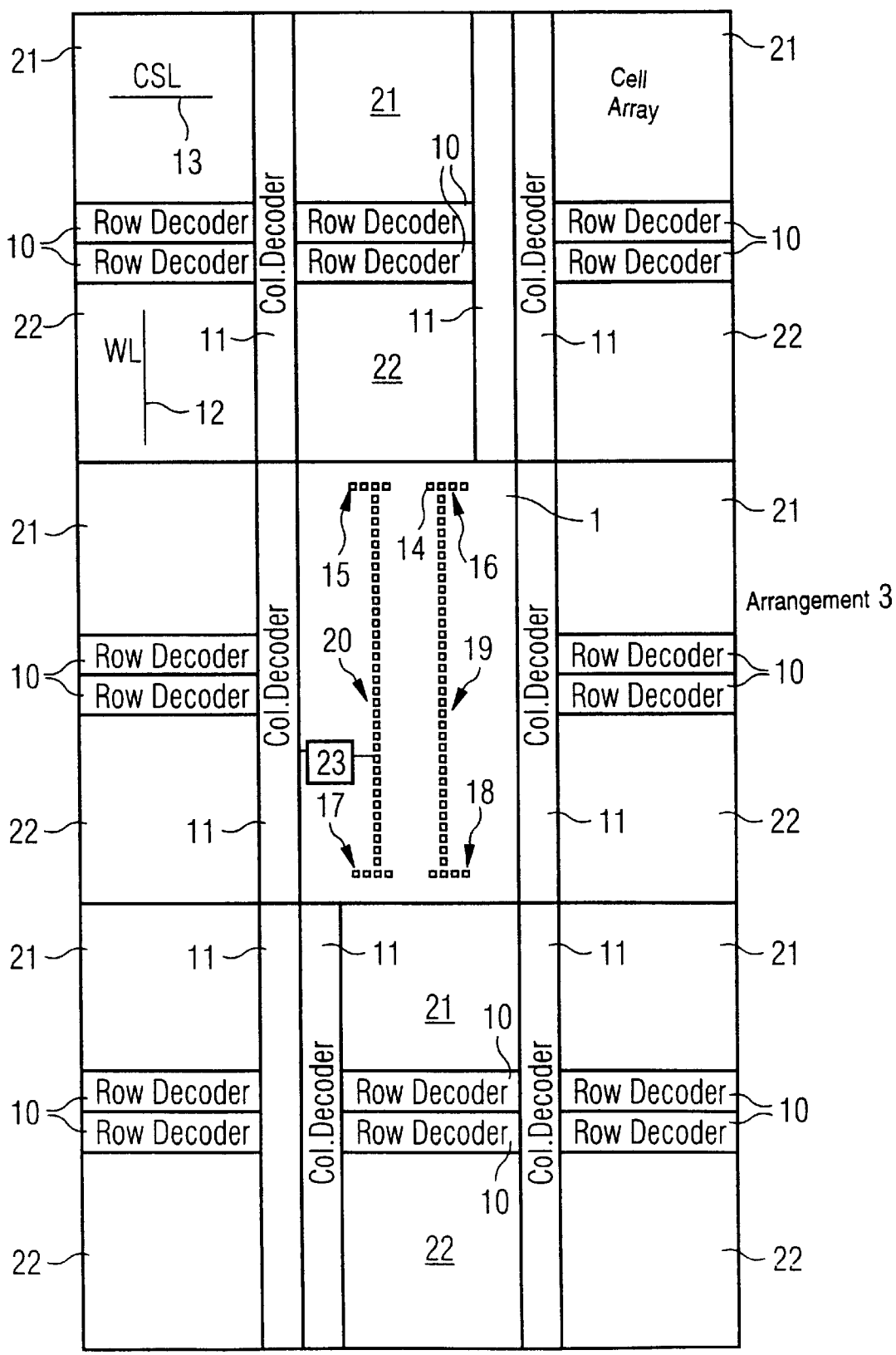
FIG. 3 is a diagrammatic illustration of a third memory configuration according to the invention.

FIG. 3 illustrates a further embodiment of a memory configuration, in which each cell array 2 to 9 is subdivided into a first and second cell subarray 21, 22, corresponding to the embodiment of FIG. 2. In the embodiment of FIG. 3, however, each cell array 2 to 9 has a column decoder 11 along a longitudinal edge. In addition, in each case a row decoder 10 for a cell subarray 21, 22 is disposed in each cell array. Otherwise, the construction of the cell arrays corresponds to the construction from FIG. 2.

A further difference from FIG. 2 is in the configuration of the bonding pads 14 in the connection area 1. Although the first, second, third, and fourth rows 14, 15, 16, 17, 18 are disposed so as to correspond to FIG. 2, the fifth and sixth rows 19, 20 are formed parallel to the longitudinal edges. The fifth row 19 is disposed between the second and fourth rows 16, 18, and the sixth row 20 is disposed between the first and third rows 15, 17. Peripheral circuits 23 are likewise integrated in the connection area 1.

All the peripheral circuits that are needed to operate the memory configuration are preferably disposed in the first connection area of the memory configurations of FIGS. 1, 2, and 3.

We claim:

1. A memory configuration, comprising:
   a centrally disposed connection area having:
      four side edges including longitudinal sides; and
      connecting pads;
   address lines;
   cell arrays having side edges;
   said cell arrays:
      adjoining said connection area;
      disposed on each of said four side edges of said connection area in a closed ring around said connection area;
      each having a matrix-like memory with decoders each connected to at least one of said address lines;
      each having at least two side edges adjoining side edges of two other ones of said cell arrays; and
      each subdivided in a longitudinal direction into a first cell subarray and a second cell subarray;
   said connecting pads electrically connected to said cell arrays;
   each of said first and second cell subarrays having:
      longitudinal sides adjoining one of said connection area and another one of said cell arrays; and
      a decoder disposed along one of said longitudinal sides adjoining one of said connection area and said other one of said cell arrays;
   each of said cell arrays having two mutually adjoining decoders disposed in a center of one of said longitudinal sides of said connection area;
   said decoders disposed at right angles to one of said longitudinal sides adjoining one of said connection area and said other one of said cell arrays;
   a first of said decoders connected to first of said address lines disposed parallel to said longitudinal direction in said first cell subarray, and
   a second of said decoders connected to second of said address lines disposed parallel to said longitudinal direction in said second cell subarray.

2. The memory configuration according to claim 1, wherein said decoders of each of said cell arrays include row decoders and column decoders each connected to said address lines.

3. The memory configuration according to claim 1, wherein said decoder of each of said first and second cell subarrays is one of the group consisting of a row decoder and a column decoder.

4. The memory configuration according to claim 1, wherein:
   said connection area is rectangular and has four corner areas;
   said cell arrays are each rectangular;
   each of said four side edges of said connection area have a respective length;
   four of said cell arrays adjoin a respective one of said four side edges of said connection area and each of said four cell arrays have a side edge with a length equal to said respective length of each of said four side edges;
   others of said cell arrays are respectively disposed in each of said four corner areas; and
   an overall area defined by said connection area and said cell arrays is rectangular.

5. The memory configuration according to claim 1, wherein:
   said connection area has transverse sides;
   said connecting pads include connecting pad rows;
   a first row, a second row, a third row, and a fourth row of said connecting pad rows are disposed at a predefined distance parallel to said transverse sides of said connection area;
   a fifth row and a sixth row of said connecting pad rows are disposed at a predefined distance parallel to said longitudinal sides of said connection area;
   said first and second rows and said third and fourth rows are respectively disposed on a given line and are disposed at a predefined distance from one another; and
   said fifth row and said sixth row are respectively disposed centrally with respect to said first and third rows and said second and fourth rows.

6. The memory configuration according to claim 1, wherein:
   said connection area has transverse sides;
   said connecting pads include connecting pad rows;

a first row, a second row, a third row, and a fourth row of said connecting pad rows are disposed at a predefined distance parallel to said transverse sides of said connection area;

a fifth row and a sixth row of said connecting pad rows are disposed at a predefined distance parallel to said longitudinal sides of said connection area;

said first and second rows and said third and fourth rows are respectively disposed on a given line and are disposed at a predefined distance from one another; and said fifth row and said sixth row are respectively disposed between said first, second, third, and fourth rows.

7. The memory configuration according to claim 1, wherein:

said connection area has transverse sides;

said connecting pads include connecting pad rows;

a first row, a second row, a third row, and a fourth row of said connecting pad rows are disposed at a predefined distance parallel to said transverse sides of said connection area;

a fifth row and a sixth row of said connecting pad rows are disposed at a predefined distance parallel to said longitudinal sides of said connection area;

said first and second rows and said third and fourth rows are respectively disposed on a given line and are disposed at a predefined distance from one another; and said fifth row and said sixth row are respectively disposed between said first and third rows and said second and fourth rows and said longitudinal edges of said connection area.

8. The memory configuration according to claim 1, including peripheral circuits for operating said cell arrays, said peripheral circuits connected to said cell arrays and disposed in said connection area.

9. The memory configuration according to claim 1, wherein:

said connection area has a given size and a given form; and each of said cell arrays has size substantially equal to said given size and a form substantially equal to said given form.

10. The memory configuration according to claim 1, wherein at least one of said cell arrays is subdivided into two cell subarrays.

11. The memory configuration according to claim 1, wherein said connection area is twice as long as said connection area is wide.

12. The memory configuration according to claim 1, wherein at least one of said cell arrays is twice as long as said at least one cell array is wide.

13. The memory configuration according to claim 1, wherein said connection area and said cell arrays are twice as long as they are wide.

14. A memory configuration, comprising:

a centrally-disposed, rectangular connection area having:
four side edges each with a given length;
four corners; and
connecting pads;

address lines; and rectangular cell arrays electrically connected to said connecting pads, said cell arrays:
having side edges;
adjoining said connection area;
disposed on each of said four side edges of said connection area and in each of said four corners of said connection area in a closed ring around said connection area;
each having a matrix-like memory with decoders each connected to at least one of said address lines; and
each having at least two of said side edges adjoining side edges of two other ones of said cell arrays;

said four cell arrays disposed on each of said four side edges of said connection area each having a corresponding side edge with said given length; and said connection area and said cell arrays adjoining said connecting area defining an overall rectangular area.

* * * * *